(12) United States Patent
Turley et al.

(10) Patent No.: US 10,552,569 B2
(45) Date of Patent: Feb. 4, 2020

(54) METHOD FOR CALCULATING NON-CORRECTABLE EUV BLANK FLATNESS FOR BLANK DISPOSITIONING

(71) Applicant: GLOBALFOUNDRIES INC., Grand Cayman (KY)

(72) Inventors: Christina Turley, Colchester, VT (US); Jed H. Rankin, Richmond, VT (US); Xuemei Chen, Niskayuna, NY (US); Allen H. Gabor, Katonah, NY (US); Timothy A. Brunner, Ridgefield, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 119 days.

(21) Appl. No.: 15/868,364

(22) Filed: Jan. 11, 2018

(65) Prior Publication Data
US 2019/0080038 A1 Mar. 14, 2019

Related U.S. Application Data

(60) Provisional application No. 62/556,761, filed on Sep. 11, 2017.

(51) Int. Cl.
*G06F 17/50* (2006.01)
*G03F 1/22* (2012.01)
(Continued)

(52) U.S. Cl.
CPC ............ *G06F 17/5081* (2013.01); *G03F 1/22* (2013.01); *G03F 1/24* (2013.01); *G03F 1/84* (2013.01)

(58) Field of Classification Search
CPC ..... G03F 1/58; G03F 1/20; G03F 1/44; G03F 7/00; G03F 7/26; G03F 1/144;
(Continued)

(56) References Cited

U.S. PATENT DOCUMENTS

2003/0186624 A1* 10/2003 Koike .................... B24B 37/30
451/8
2005/0281451 A1* 12/2005 Starikov ............ G05B 23/0229
382/141
(Continued)

FOREIGN PATENT DOCUMENTS

CN         101533228       9/2009
EP          1677157        7/2006
(Continued)

OTHER PUBLICATIONS

Ballman et al., Error Analysis of Overlay Compensation Methodologies and Proposed Functional Tolerances for EUV Photomask Flatness, Corning incorporated, 12 pages (Year: 2016)*
(Continued)

*Primary Examiner* — Nghia M Doan
(74) *Attorney, Agent, or Firm* — Michael LeStrange; Andrew M. Calderon; Roberts Mlotkowski Safran Cole & Calderon, P.C.

(57) ABSTRACT

The present disclosure generally relates to semiconductor structures and, more particularly, to mask structures and methods of manufacture. The method includes determining a plane through a frontside surface and a backside surface of a mask, each plane representing a flatness of the frontside surface and the backside surface, respectively; subtracting, using at least one computing device, a difference between the plane of the frontside surface and the plane of the backside surface to find a thickness variation; generating, using the at least one computing device, a fitting to fit the thickness variation; and subtracting, using the at least one computing device, the fitting from the thickness variation to generate a residual structure for collecting a residual flatness measurement.

20 Claims, 10 Drawing Sheets

(51) Int. Cl.
*G03F 1/24* (2012.01)
*G03F 1/84* (2012.01)

(58) Field of Classification Search
CPC ...... G03F 7/0002; G03F 7/0037; G03F 7/705; G03F 7/7055; G03F 7/70575; G03F 7/706; G03F 7/70683; G03F 9/7011
USPC .................................. 716/50–55; 430/5, 30
See application file for complete search history.

(56) References Cited

U.S. PATENT DOCUMENTS

2006/0024591 A1* 2/2006 Itoh ........................... G03F 1/70
   430/5
2006/0166109 A1* 7/2006 Yan ........................ B82Y 10/00
   430/5

FOREIGN PATENT DOCUMENTS

| EP | 2434345 A1 | 3/2012 |
| TW | 201243487 | 11/2012 |
| TW | 201514613 | 4/2015 |
| TW | 201704851 | 2/2017 |

OTHER PUBLICATIONS

Taiwanese Office Action dated Nov. 21, 2018 in related TW Application No. 107107721, 5 pages.
Manish Chandhok et al., "Compensation of overlay errors due to mask bending and nonflatness for EUV masks", Proceedings of SPIE—The International Society for Optical Engineering, Mar. 2009, 13 pages.
Katherine Ballman et al., "Error Analysis of Overlay Compensation Methodologies and Proposed Functional Tolerances for EUV Photomask Flatness", Corning Incorporated, 2016, 12 pages.
Taiwanese Notice of Allowance dated May 30, 2019 in related TW Application No. 107107721, 4 pages.

* cited by examiner

METHOD FOR CALCULATING NON-CORRECTABLE EUV BLANK FLATNESS FOR BLANK DISPOSITIONING

FIELD OF THE INVENTION

The present disclosure generally relates to semiconductor structures and, more particularly, to mask structures and methods of manufacture.

BACKGROUND

In lithography techniques, a mask is implemented in patterning the layers of a device. During the lithography process, each layer needs to be patterned accurately so that there are no discrepancies in the overlaying of the layers. As such, inaccuracies from the lithography techniques should be minimized.

As technology nodes shrink, extreme ultraviolet (EUV) lithography masks are becoming more prevalent in the lithography process. An EUV photomask is a patterned reflective mask, compared to an optically transparent mask. That is, EUV masks are fundamentally different from traditional optical masks, as they are reflective masks that require a low surface roughness on the order of a few atoms. These types of masks also have stringent flatness and curvature requirements.

As with all masks, EUV masks are fabricated from blanks. However, fabricating EUV masks is particularly difficult, noting that they are reflective and used for small technology nodes. Issues resulting from improper or inaccurate mask fabrication can result in image placement errors, which can contribute to overlay errors. These image placement errors can be caused by discrepancies from the flatness of the blanks. Accordingly, flatness specifications for the mask blanks which cause overlay issues are of critical importance to address.

SUMMARY

In an aspect of the disclosure, a method comprises: determining a plane through a frontside surface and a backside surface of a mask, each plane representing a flatness of the frontside surface and the backside; subtracting, using the at least one computing device, a difference between the plane of the frontside surface and the plane of the backside surface to find a thickness variation; generating, using the at least one computing device, a fitting to fit the thickness variation; and subtracting, using the at least one computing device, the fitting from the thickness variation to generate a residual structure for collecting a residual flatness measurement.

In an aspect of the disclosure, a computer program product comprises: a computer readable storage medium having program instructions embodied therewith, and the program instructions are readable by a computing device to cause the computing device to: find a thickness variation by subtracting a flatness between a frontside surface and a backside surface of a structure; fit the thickness variation with a polynomial fit; generate a residual structure by subtracting the polynomial fit from the thickness variation; and find a residual flatness measurement by taking a difference between the highest point and the lowest point present in the residual structure.

In an aspect of the disclosure, a system for analyzing blank flatness comprises: a CPU, a computer readable memory and a computer readable storage media; first program instructions to find a thickness variation of a structure by subtracting a flatness between a frontside surface and a backside surface of the structure; second program instructions to fit the thickness variation with a polynomial fit; third program instructions to generate a residual structure by subtracting the polynomial fit from the thickness variation; and fourth program instructions to find a residual flatness measurement by taking a difference between the highest point and the lowest point present in the residual structure, wherein the first, second, third and fourth program instructions are stored on the computer readable storage media for execution by the CPU via the computer readable memory.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to mask structures and methods of manufacture. In embodiments, the processes described herein include a mask analysis to ensure that the masks are within a certain flatness specification. For example, the mask for lithography meets a flatness specification as calculated using a non-correctable blank flatness for blank dispositioning in lithography processes. In this way, flatness measurements provided herein emulate an actual use case for lithography processes, such as an extreme ultraviolet (EUV) lithography technique, amongst other examples. More specifically, the flatness measurement that is disclosed herein takes into account the backside surface flatness features, as opposed to looking only at the frontside surface flatness of the mask blank. Additionally, the flatness measurement takes into account the corrections implemented by the stepper machine in addressing some of the image placement errors.

Generally, most mask blanks do not meet specification requirements for EUV lithography processes, and require mask write compensation, e.g., software such as iHOPC, to correct image placement errors. Examples of correcting coefficients include mask 3rd order compensation and mask 6th order compensation, for example. Examples of image placement errors include Out of Plane Distortion (OPD) and In Plane Distortion (IPD), amongst other examples. Image placement errors because of OPD ($IPE_{OPD}$) are introduced when the chucked mask frontside is illuminated at an incident angle of 6 degrees, as an example.

More specifically, in $IPE_{OPD}$ a backside non-flatness is partially transferred to the frontside when the mask is flattened, and the as-chucked frontside surface is approximated as thickness variations. This produces a ring field illumination, which has a subtle effect on the x and y components of $IPE_{OPD}$. Image placement errors because of IPD ($IPE_{IPD}$) are introduced when the mask backside is flattened during electrostatic chucking. More specifically, during a mask write, the mask is mounted to the E-chuck using kinematic clamps. However, the backside of the mask is not flat, thereby causing a gravity sag which needs to be compensated during the mask write operation.

The processes described herein provide accurate calculations for determining mask flatness issues which may cause image placement errors. In embodiments, a thickness variation is calculated to better represent the mask structures on a tool, such as an electrostatic chuck (E-chuck) used in the EUV lithography process. In the EUV lithography process, the stepper machine carrying out the EUV lithography is programmed to take into account image placement errors and to rectify these errors. However, these errors can be too numerous for the stepper (scanner) to resolve. Therefore, in embodiments, calculations are performed to calculate the surface flatness features which are not correctable in the stepper, i.e., a non-correctable flatness of the mask blank. More specifically, the processes described herein calculate an effective non-correctable surface flatness for mask blanks, which accounts for a flatness of a mask blank after chucking and the removal of correctable coefficients in the scanner (stepper). In this way, by calculating which masks meet flatness requirements, the processes provided herein emulate an actual use cause of the mask during the EUV lithography process, thereby noting which masks can be used to reduce image placement errors.

The structures of the present disclosure can be manufactured in a number of ways using a number of different tools. In general, though, the methodologies and tools used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1A:
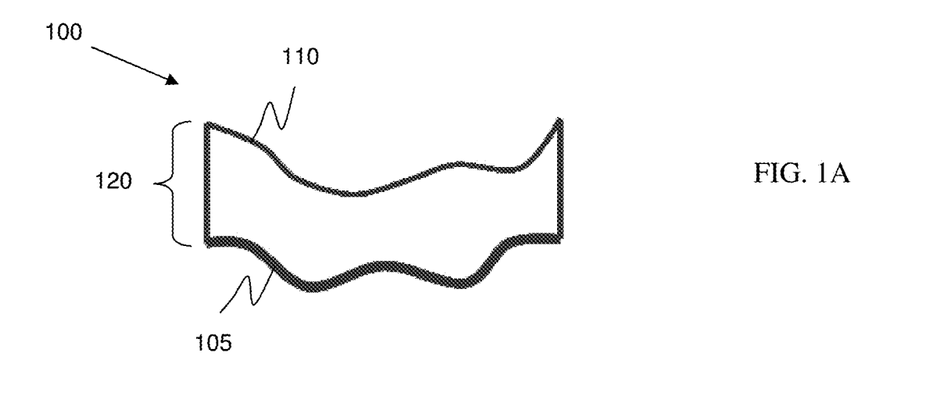
FIG. 1A shows an incoming structure, amongst other features, and respective fabrication processes in accordance with aspects of the present disclosure.

FIG. 1A illustrates an EUV mask 100. During lithography, the mask 100 is used as a template to pattern the layers of a device. During the EUV lithography processes, the mask 100 is placed in a lithography scanner, i.e., a stepper machine. The stepper machine includes a light source which projects the light onto the layers of the circuit for patterning, via the reflection from the mask. In this way, the mask 100 can be made of suitable materials which reflect a light source, i.e., materials which can act as a mirror to reflect light. Reflecting the light by the EUV mask offers the benefits of reduced wavelengths of light (compared to transmissive masks), which provides a greater resolution in the patterns. Due to the reflectiveness of the mask, the surface flatness of the mask has more of an implication in the accuracy of the patterning in comparison to masks which transmit the light, i.e., optical transmissive masks where the light passes straight through.

The mask 100 includes a frontside 105 and a backside 110, each with varying surface flatness. It is these variations in surface flatness features which can cause discrepancies (overlay issues) in the patterns. More specifically, these flatness issues can cause overlay issues between the various layers, amongst other issues. In the EUV lithography process, the backside 110 of the mask 100 is covered with a back film and the frontside 105 of the mask 100 is covered with a front film. The backside 110 of the mask 100 will be attached to the chuck by pin chucks and electrostatic forces (e.g., E-chuck), while the front film contains the pattern which is to be reflected onto the layers being patterned.

More specifically, in mounting the mask 100 to the E-chuck, the backside 110 of the mask 100 is flattened. This flattening of the backside 110 of the mask 100 causes the front film and the accompanying patterns to change, resulting in an inaccurate pattern being reflected onto the device layers. More specifically, in some circumstances, a change in the surface roughness can be caused by the backside flattening when chucked. This results in the front film pattern being changed resulting, in turn, image placement errors, such as OPD and IPD, amongst other issues. The image placement errors cause unwanted shifts in the wafer.

Figure 1B:
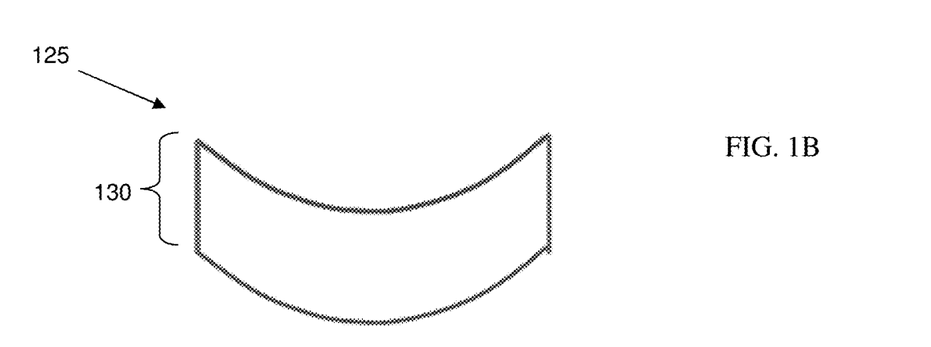
FIG. 1B shows a thickness variation structure, amongst other features, and respective fabrication processes in accordance with aspects of the present disclosure.
Figure 1C:
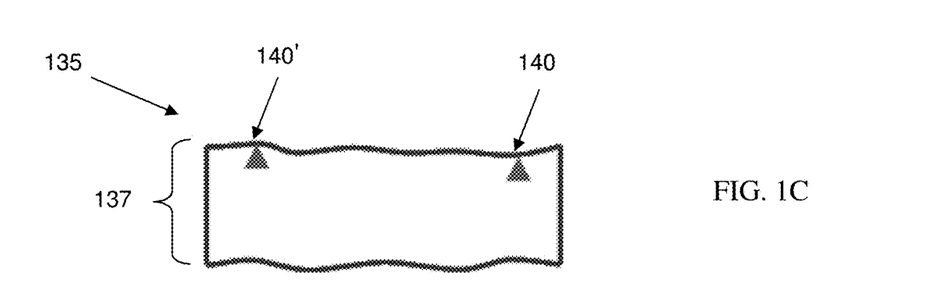
FIG. 1C shows a residual structure, amongst other features, and respective fabrication processes in accordance with aspects of the present disclosure.

FIGS. 1A-1C illustratively show an analysis and compensation of the surface flatness of the frontside 105 and the backside 110 of the mask in a 3D structure to emulate an actual use case. More specifically, the structures and processes described herein take into account the backside surface flatness features of the mask 100, as opposed to looking only at the frontside surface flatness features. FIG. 1A illustrates a thickness variation 120, which is the difference between the frontside 105 and the backside 110 of the mask blank at incremental locations. In embodiments, for the thickness variation 120, the entirety of the mask blank is analyzed, with the differences between the frontside 105 and the backside 110 being measured throughout the mask 100. More specifically, the frontside flatness has a front plane extending therethrough, and the backside flatness has a back plane extending therethrough, with the thickness variation being calculated from the difference between the front plane and the back plane. As an example, the thickness variation 120 can be a measurement of the difference between the frontside 105 and the backside 110 in a 1600×1600 pixel array. As a further example, a 152 mm×152 mm area of the mask blank can be analyzed to obtain the thickness variation. In embodiments, the thickness variation 120 is not a measurement of the true thickness of the mask blank.

FIG. 1B shows a stepper fitting structure 125, which attempts to fit as closely as possible the thickness variation 120 of FIG. 1A. In embodiments, the fitting structure 125 is polynomial fit formed by taking into account the stepper correcting coefficients 130, which correct image placement errors in the stepper machine. Examples of the correcting coefficients 130 include scanner linear correction and scanner high-order correction, amongst other examples. In embodiments, the polynomial fit of the fitting structure 125 can be represented by the function shown in equation (1).

$$a+bX+cY+dX^2+eXY+fY^2+gX^3+hX^2Y+jXY^2+kY^3 \qquad (1)$$

As an example, for a specific mask blank, the correction would be:

$$0.0004+0.00001X+0.00002Y+0.00017X^2-0.00002XY-\\0.00008Y^2+0.00018X^2Y-0.00005XY^2-0.00007Y^3$$

FIG. 1C shows a residual structure 135 formed from the differences between the thickness variation 120 and the fitting structure 125. By subtracting the fitting structure 125 from the thickness variation 120, the residual structure 135 represents any non-correctable flatness 137 which remains, such as a non-correctable flatness which remains on the backside surface of the mask blank. Valleys (v) 140 represent the lowest points on the surface of the non-correctable flatness 137, while peaks (p) 140' represent the highest points on the surface of the non-correctable flatness 137. In embodiments, the flatness of the non-correctable flatness 137 can be calculated by taking the difference between the valleys 140 and peaks 140', i.e., Flatness=p−v.

FIGS. 2A-2F illustrate a specific example of the flatness calculations of the present disclosure. The processes described herein will illustratively show the calculations needed to determine which masks can be used in EUV lithography based on their flatness profile, as described with respect to the illustrations shown in FIGS. 2A-2F.

Figure 2A:
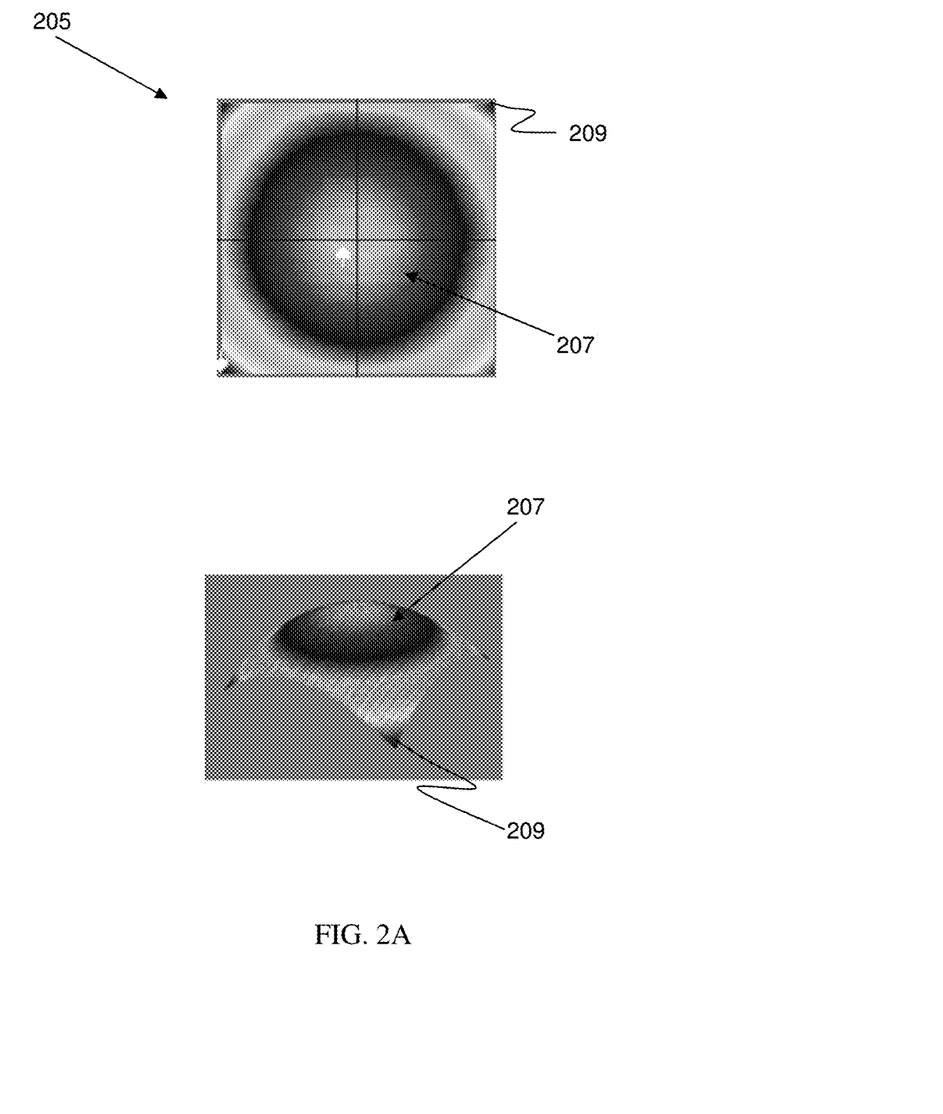
FIG. 2A shows the topography of a front surface, amongst other features, and respective fabrication processes in accordance with aspects of the present disclosure.

As illustratively shown in FIG. 2A, the process begins with measuring the surface flatness of the frontside surface 205 of the mask. For example, FIG. 2A shows a topography measurement/calculation of a frontside surface 205, with the highest point 207 being in the middle and the lowest point 209 on the outer edge. In embodiments, the flatness of the frontside surface 205 is determined by taking the difference between the highest point 207 and the lowest point 209. In embodiments, the difference between the highest point 207 and the lowest point 209 can be 290 nm, amongst other examples. Currently, industry practice is to spec the mask blanks at this value of 290 nm of non-flatness.

Figure 2B:
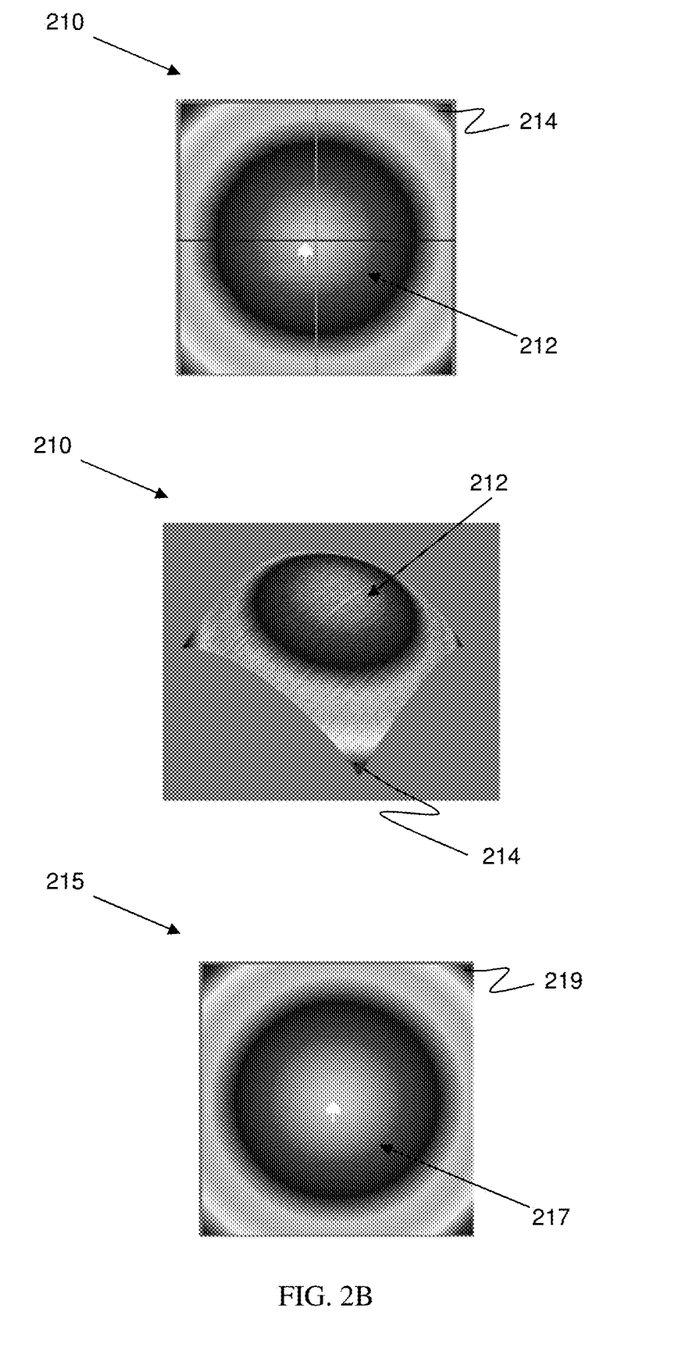
FIG. 2B shows the topography of a back surface, amongst other features, and respective fabrication processes in accordance with aspects of the present disclosure.

As illustratively shown in FIG. 2B, the process continues with measuring the surface flatness of the backside surface 210 of the mask. For example, FIG. 2B shows a topography measurement/calculation of a backside surface 210, with the highest point 212 being in the middle and the lowest point 214 on the outer edge. In embodiments, the flatness of the backside surface 210 is determined by taking the difference between the highest point 212 and the lowest point 214. In embodiments, the difference between the highest point 212 and the lowest point 214 can be 319 nm, amongst other examples.

FIG. 2B further shows a back 5th order surface 215, with the highest point 217 being in the middle and the lowest point 219 on the outer edge. In embodiments, the back 5th order surface 215 is a smoothing algorithm of the backside surface 210 data. More specifically, back 5th order surface 215 represents how much of the non-flatness of the backside surface 210 comes through and transfers to the thickness variation. In embodiments, the difference between the highest point 217 and the lowest point 219 the back 5th order surface 215 can be 309 nm, amongst other examples. In further embodiments, the back 5th order surface 215 can instead be a back 10th order surface, or any order, i.e., a back Xth order surface.

Figure 2C:
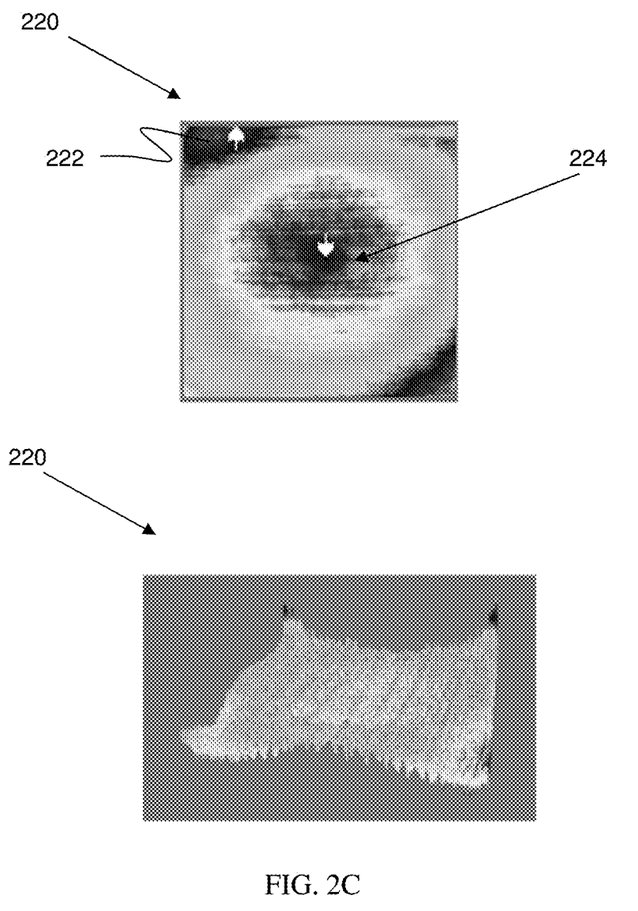
FIG. 2C shows the topography of a thickness variation, amongst other features, and respective fabrication processes in accordance with aspects of the present disclosure.

As illustratively shown in FIG. 2C, the process continues with a calculation of the topography of a total chucked thickness variation 220. At this point in the process, the thickness variation of a chucked mask is calculated, i.e., the total chucked thickness variation 220. In embodiments, the total chucked thickness variation 220 can be calculated by taking the difference from a plane extending through the frontside surface 205 and a plane extending through the backside surface 210. The total chucked thickness variation 220 includes using a highest point 222 on an outer edge and a lowest point 224 in the middle, amongst other finite measurements throughout these surfaces. In embodiments, the difference between the highest point 222 and the lowest point 224 can be 59 nm, amongst other examples.

Figure 2D:
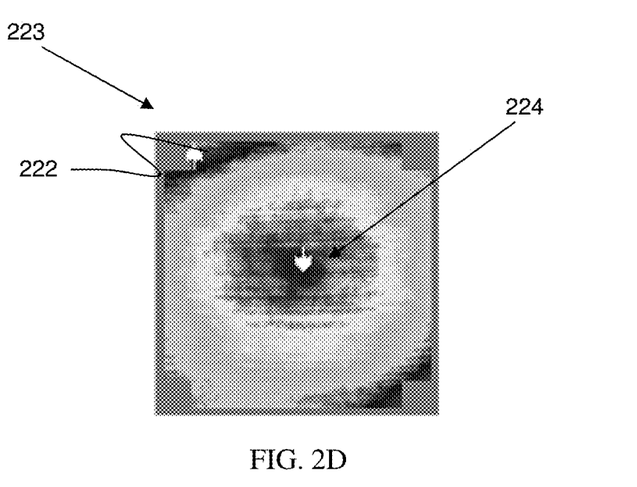
FIG. 2D shows a quality area, amongst other features, and respective fabrication processes in accordance with aspects of the present disclosure.

As illustratively shown in FIG. 2A, the process continues with the calculation of a quality area (QA) 223, which is a snapshot of the total chucked thickness variation 220. The reduced size of the QA 223 correlates to an area of the wafer which is being patterned. More specifically, the QA 223 is noted since the total area of the mask is larger than the size of the area that is being patterned. For example, the mask blank can have a total area of 152 mm×152 mm, but the size of the area that is to be patterned is less than a total area of 152 mm×152 mm. Therefore, a QA 223 correlates to the size of the area to be patterned, with the size of the QA 223 being of different dimensions depending on the area which is being patterned. The QA 223 includes the highest point 222 on an outer edge, and the lowest point 224 in the middle, in addition to the additional measurements on the frontside and backside surfaces. In embodiments, the difference between the highest point 222 and the lowest point 224 can be 53 nm, which represents the size of the area that needs to be corrected to avoid issue placement issues.

Figure 2E:
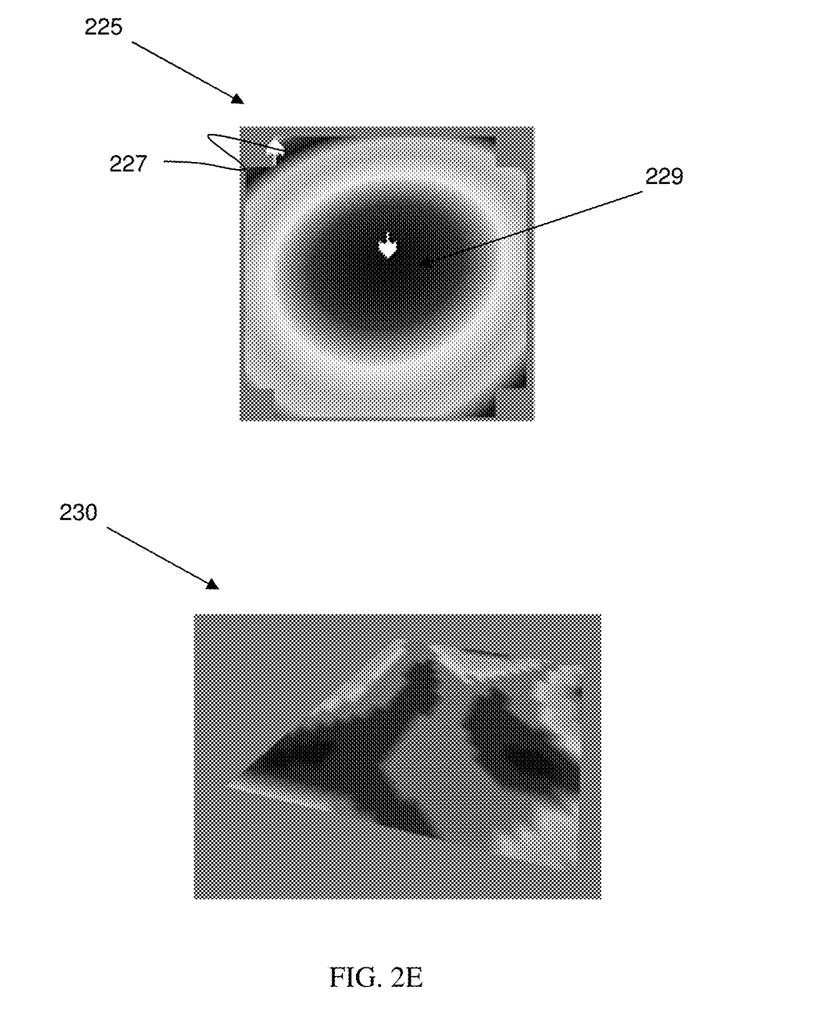
FIG. 2E shows the topography of a fitting surface, amongst other features, and respective fabrication processes in accordance with aspects of the present disclosure.

The process continues with a topography measurement/calculation of FIG. 2E shows a topography of a fitting 225, which is applied by the stepper during the EUV lithography process. The fitting 225 takes into account various stepper correcting coefficients 230, which correct some of the variations in the mask blank which may cause issue placement errors during the lithography process. More specifically, the fitting 225 takes into account the flatness surface which has been corrected by the stepper correcting coefficients 230. In embodiments, the stepper correcting coefficients 230 can be carried out by software programmed within the stepper machine, such as iHOPC, amongst other examples. Examples of the stepper correcting coefficients 230 include scanner linear correction and scanner high-order correction, amongst other examples. The fitting 225 includes a highest point 227 on an outer edge, and a lowest point 229 in the middle. In embodiments, the difference between the highest point 227 and the lowest point 229 can be 48 nm, amongst other examples.

Figure 2F:
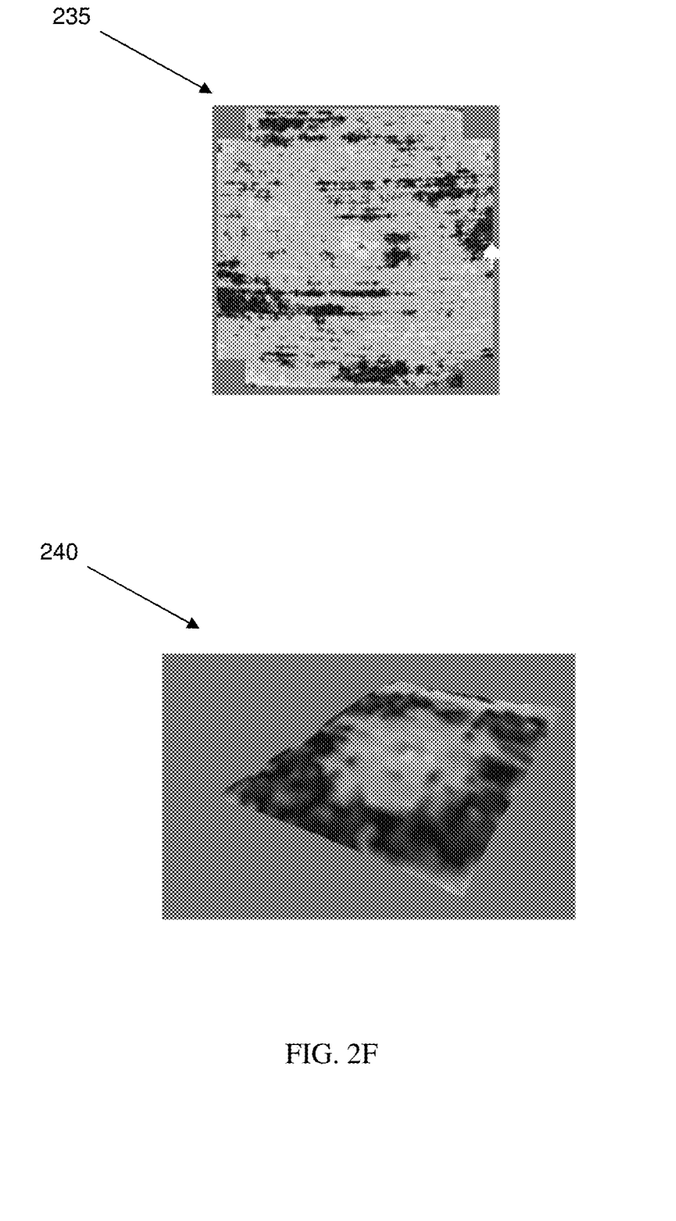
FIG. 2F shows the topography of a residual surface, amongst other features, and respective fabrication processes in accordance with aspects of the present disclosure.

As illustratively shown in FIG. 2F, the process continues by calculating a chucked residual 235, which represents a non-correctable flatness 240 remaining in the mask. The chucked residual 235 is generated by taking the difference between the QA 223 and the fitting 225. In embodiments, the difference can be executed as a point by point subtraction along the surfaces. In this way, the stepper correcting coefficients 230 are removed from the QA 223, leaving the chucked residual 235, representing the non-correctable flatness 240 remaining in the mask blank. It is this non-correctable flatness 240 that can cause wafer image placement issues, such as OPD and IPD, amongst other examples.

In this specific example, the size of the non-correctable flatness 240 can be 15.4 nm, amongst other examples. In this example, it is the remaining non-flatness of 15.4 nm in the mask blank which causes the image placement errors. More specifically, the height difference between the highest point in the chucked residual 235 and the lowest point in the chucked residual 235 is 15.4 nm. Therefore, mask blanks having a surface flatness height difference of less than 16 nm can cause image placement errors below 0.3 nm on the wafer. The non-correctable flatness 240 can then be used as a guideline for which masks will meet the requirements of the user. Further, the non-correctable flatness 240 allows to better inform mask blank suppliers of flatness tolerances for flatness features which matter most.

Figure 3A:
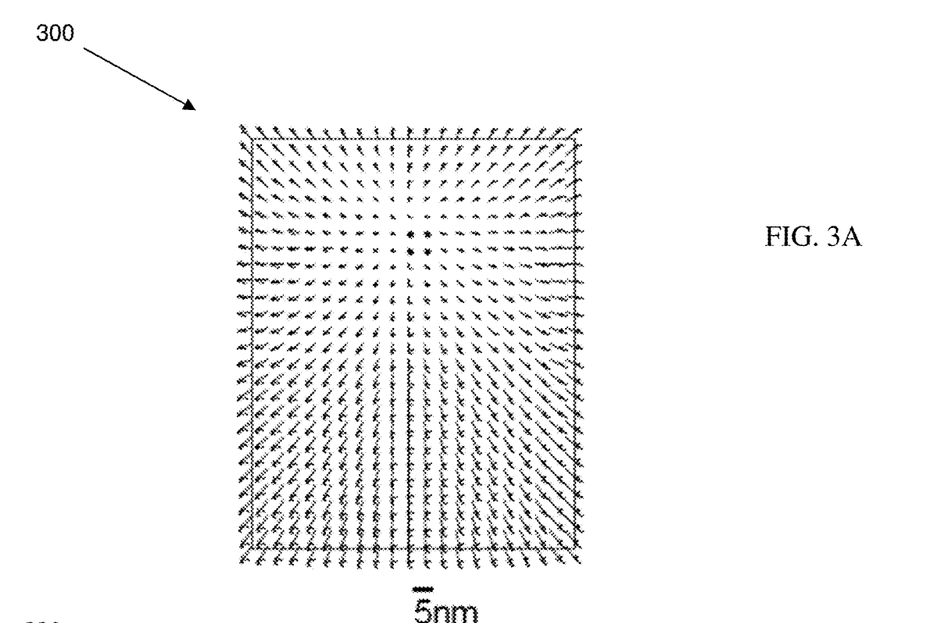
FIG. 3A shows an uncorrected predicted overlay structure, amongst other features, and respective fabrication processes in accordance with aspects of the present disclosure.
Figure 3B:
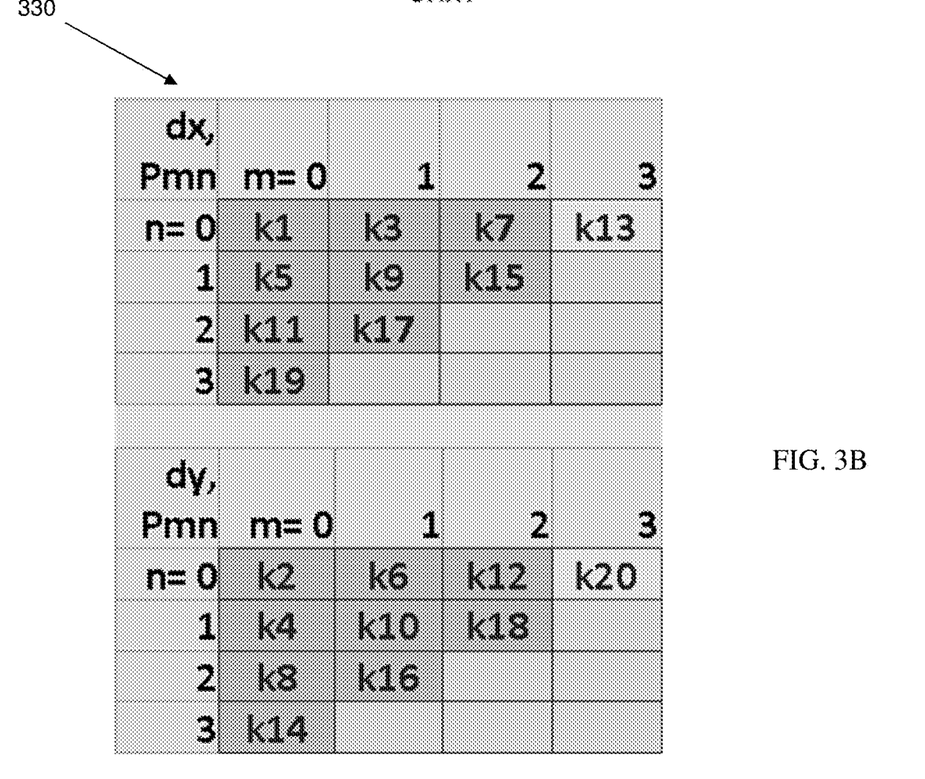
FIG. 3B shows stepper correcting coefficients, amongst other features, and respective fabrication processes in accordance with aspects of the present disclosure.
Figure 3C:
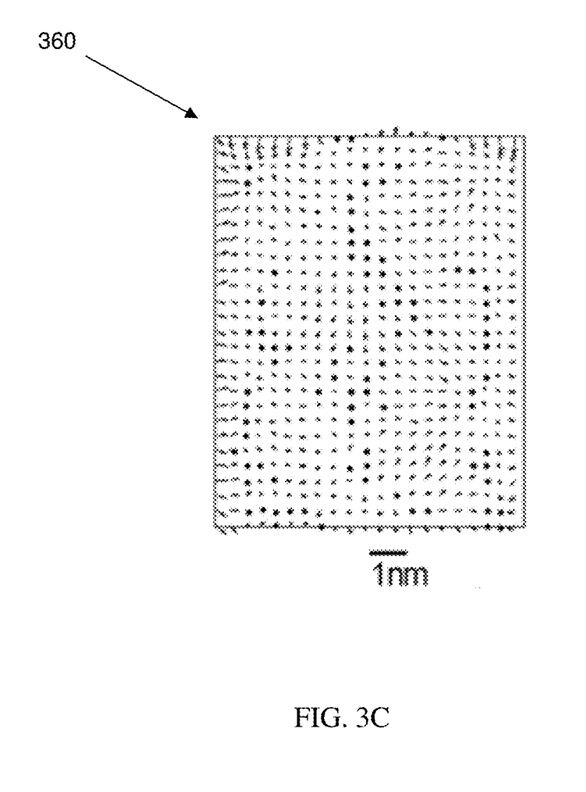
FIG. 3C shows an actual use predicted overlay structure, amongst other features, and respective fabrication processes in accordance with aspects of the present disclosure.

FIG. 3A shows an uncorrected predicted overlay 300, prior to corrections from the stepper machine. More specifically, FIG. 3A illustrates what appears on the wafer without any corrections to the mask blank, with the various arrows showing how far off the points are from where the overlay points should be. FIG. 3B shows a table of stepper correcting coefficients 330 applied in the x and y directions, such as scanner linear correction and scanner high-order correction, amongst other examples. FIG. 3C shows a predicted actual use overlay 360, which has been corrected using the stepper correcting coefficients 230, such as the scanner high-order correction coefficient. The information illustrated in the predicted actual use overlay 360 can then be used to further determine the non-correctable flatness.

Figure 4A:
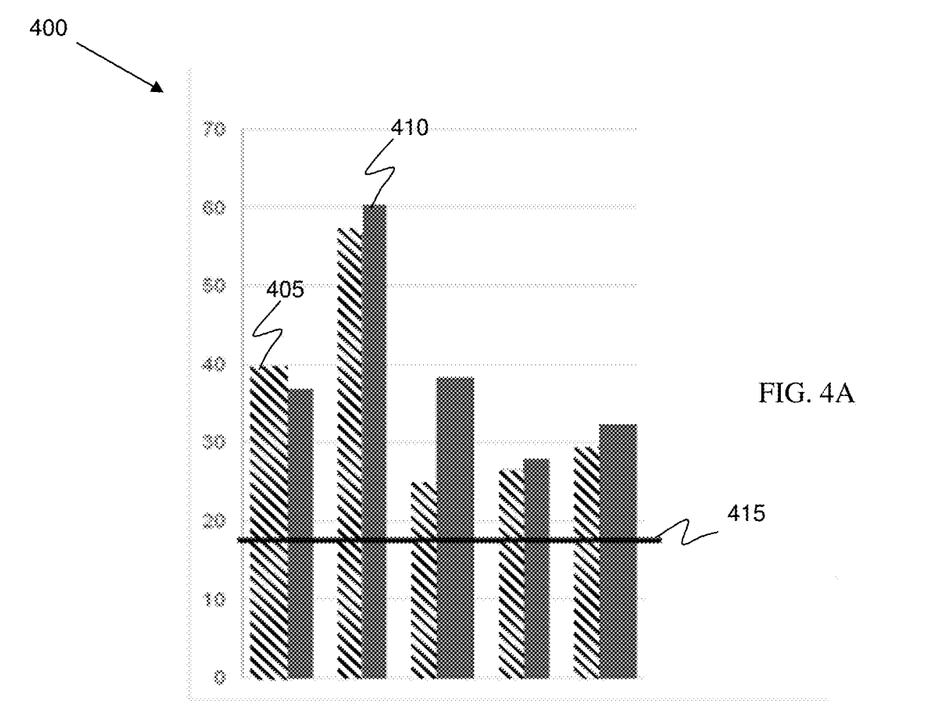
FIGS. 4A and 4B show surface flatness results, amongst other features, and respective fabrication processes in accordance with aspects of the present disclosure.
Figure 4B:
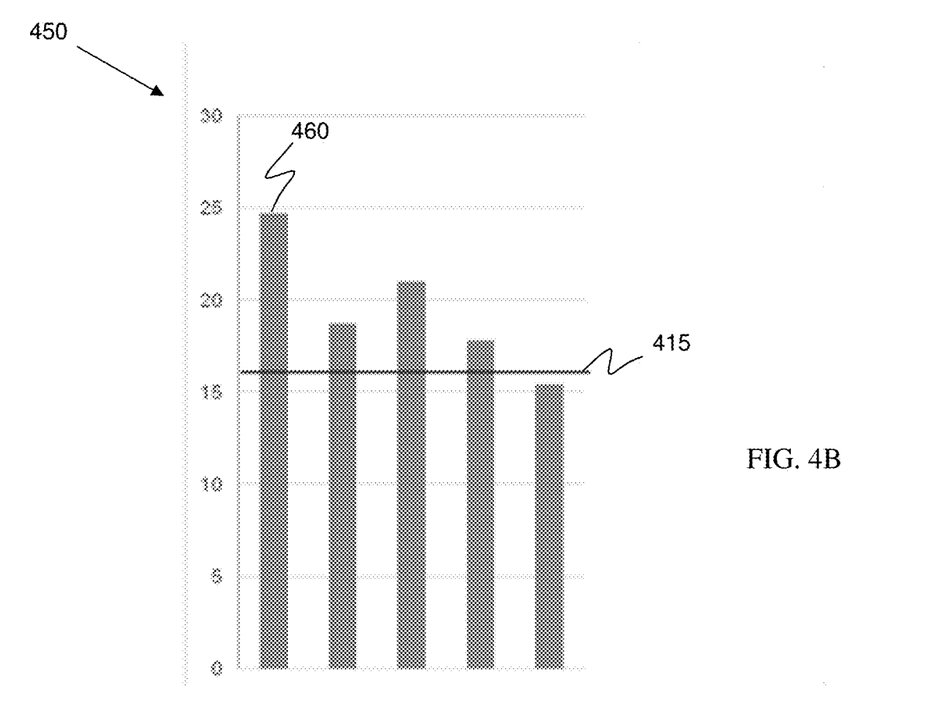

FIGS. 4A and 4B illustrate a mask flatness received from the supplier compared to what is desired by the user. In embodiments, the structures and processes described herein can be applied to a mask which has already been received from a mask blank supplier. The chart 400 of FIG. 4A illustrates a frontside flatness 405 and a backside flatness 410 for a mask blank received from the supplier. The spec 415 provided in this mask blank is below 20 nm. However, in the previous examples discussed in FIGS. 2A-2F, the desired non-correctable flatness was found to be 15.4 nm. The non-correctable flatness of 15.4 nm is illustrated in chart 450 of FIG. 4B as the spec 415, for the non-correctable flatness 460. Therefore, in this example, the mask blank of FIG. 4A received from the supplier would be out of spec for the user's needs. However, these mask blanks may still be utilized by the user.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects. Furthermore, aspects of the present disclosure may take the form of a computer program product embodied in one or more computer readable storage medium(s) having computer readable program code embodied thereon.

The computer readable storage medium (or media) having computer readable program instructions thereon causes one or more computing processors to carry out aspects of the present disclosure. The computer readable storage medium can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing.

A non-exhaustive list of more specific examples of the computer readable storage medium includes the following non-transitory signals: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, and any suitable combination of the foregoing. The computer readable storage medium is not to be construed as transitory signals per se; instead, the computer readable storage medium is a physical medium or device which stores the data. The computer readable program instructions may also be loaded onto a computer, for execution of the instructions, as shown in FIG. 1.

Figure 5:
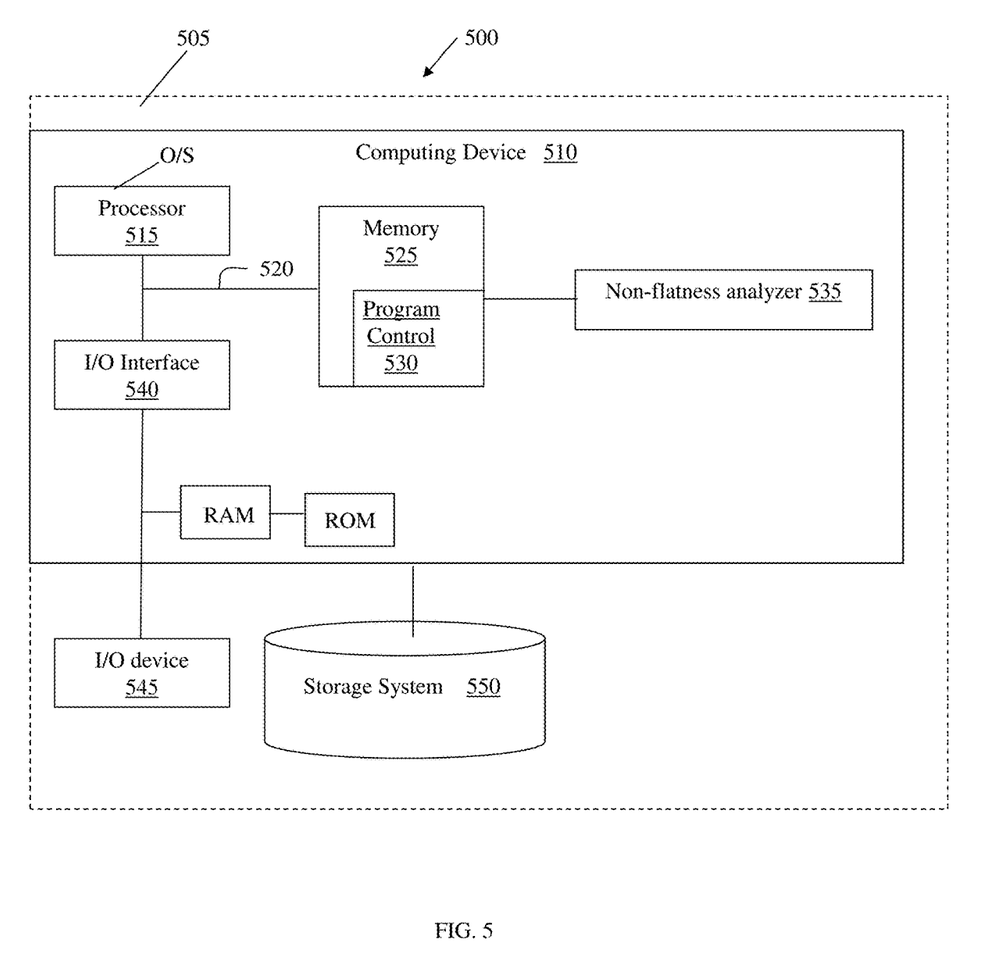
FIG. 5 shows an illustrative infrastructure for implementing non-flatness measurements and analysis in accordance with aspects of the invention.

FIG. 5 shows a computer infrastructure 500 for implementing the steps in accordance with aspects of the disclosure. To this extent, the infrastructure 500 can implement the analysis and measurement of the non-flatness of the mask blanks as shown in FIGS. 1A-2F, e.g., finding the thickness variation and generating the non-correctable flatness measurement. The infrastructure 500 includes a server 505 or other computing system that can perform the processes described herein. In particular, the server 505 includes a computing device 510. The computing device 510 can be resident on a network infrastructure or computing device of a third party service provider (any of which is generally represented in FIG. 5).

The computing device 510 includes a processor 515 (e.g., CPU), memory 525, an I/O interface 540, and a bus 520. The memory 525 can include local memory employed during actual execution of program code, bulk storage, and cache memories which provide temporary storage of at least some program code in order to reduce the number of times code which are retrieved from bulk storage during execution. In addition, the computing device includes random access memory (RAM), a read-only memory (ROM), and an operating system (O/S).

The computing device 510 is in communication with external I/O device/resource 545 and storage system 550. For example, I/O device 545 can comprise any device that enables an individual to interact with computing device 510 (e.g., user interface) or any device that enables computing device 510 to communicate with one or more other computing devices using any type of communications link. The external I/O device/resource 545 may be for example, a handheld device, PDA, handset, keyboard etc.

In general, processor 515 executes computer program code (e.g., program control 530), which can be stored in memory 525 and/or storage system 550. Moreover, in accordance with aspects of the invention, program control 530 controls a non-flatness analyzer tool 535, which generates the flatness structures and measurements provided herein to emulate an actual use case for lithography processes, such as an EUV lithography technique. The non-flatness analyzer tool 535 can be implemented as one or more program codes in program control 530 stored in memory 525 as separate or combined modules.

Additionally, the non-flatness analyzer tool 535 may be implemented as separate dedicated processors or a single or several processors to provide the function of this tool. While executing the computer program code, the processor 515 can read and/or write data to/from memory 525, storage system 550, and/or I/O interface 540. The program code executes the processes of the invention. The bus 520 provides a communications link between each of the components in computing device 510.

The non-flatness analyzer tool 535 is utilized to perform the non-flatness measurements and analysis of mask blanks used in lithography processes, such as EUV lithography techniques. For example, the non-flatness analyzer tool 535 generates a front plane extending through the frontside flatness and a back plane extending through the backside flatness. The non-flatness analyzer tool 535 will find the thickness variation of the mask blank by taking the difference between the front plane and the back plane. In addition, the non-flatness analyzer tool 535 can take a snapshot of a specific area of the thickness variation, which is a quality area (QA) which correlates to an area on the wafer that is being patterned.

The non-flatness analyzer tool 535 will generate a stepper fitting structure, which attempts to fit as closely as possible to the thickness variation. In embodiments, the stepper fitting structure is polynomial fit formed by taking into account the stepper correcting coefficients. The non-flatness analyzer tool 535 will then generate a residual structure formed from the differences between the thickness variation, i.e., the QA, and the stepper fitting structure. The residual structure represents any non-correctable flatness which remains, such as a non-correctable flatness which remains on the backside surface of the mask blank. The non-flatness analyzer tool 535 finds the non-correctable flatness by taking the difference between the valleys and peaks of the residual structure. In embodiments, the non-flatness analyzer tool 535 can also compare incoming mask blanks to the found non-correctable flatness in order to determine if the incoming mask blanks satisfy the user's specs.

Although the systems and methods described hereafter are with regard to exemplary methods, and/or computer program products, it should be understood that other implementations are also contemplated by the present disclosure as described herein. For example, other devices, systems, appliances, and/or computer program products according to embodiments of the present disclosure will be or become apparent to one of ordinary skill in the art upon review of the drawings and detailed description. It is intended that all such additional other devices, systems, appliances, processes, and/or computer program products be included within the scope of the present disclosure.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
   determining a plane through a frontside surface and a backside surface of a mask, each plane representing a flatness of the frontside surface and the backside surface, respectively;
   subtracting, using at least one computing device, a difference between the plane of the frontside surface and the plane of the backside surface to find a thickness variation;
   generating, using the at least one computing device, a fitting to fit the thickness variation;
   subtracting, using the at least one computing device, the fitting from the thickness variation to generate a residual structure for collecting a residual flatness measurement; and
   finding the residual flatness measurement by taking a difference between peaks on a surface of the residual structure and valleys on the surface of the residual structure, wherein the thickness variation is a measurement for an entirety of the mask.

2. The method of claim 1, wherein the mask is a blank mask.

3. The method of claim 1, wherein the thickness variation is a measurement of a 1600×1600 pixel array.

4. The method of claim 1, wherein the fitting is a polynomial fit.

5. The method of claim 1, wherein the residual flatness measurement is a non-correctable flatness measurement.

6. The method of claim 5, wherein the non-correctable flatness measurement comprises a difference between the highest point and the lowest point in the residual structure.

7. The method of claim 1, further comprising determining, using the at least one computing device, whether an incoming mask blank structure falls below the residual flatness measurement.

8. The method of claim 1, wherein the fitting is comprised of correcting coefficients.

9. The method of claim 8, wherein the correcting coefficients are a scanner linear correction and a scanner high-order correction.

10. The method of claim 1, further comprising smoothing, using the at least one computing device, the backside surface prior to subtracting the difference between the plane of the frontside surface and the plane of the backside surface to find a thickness variation.

11. The method of claim 10, further comprising, snap-shotting, using the at least one computing device, the thickness variation which correlates to an area on a wafer which is to be patterned, wherein the subtracting the fitting from the thickness variation to generate the residual structure includes taking a difference between the area on the wafer which is to be patterned from the fitting by executing a point by point subtraction along surfaces of the mask, and the smoothing is applied to a back 5th order surface of the backside surface which represents how much of a non-flatness of the backside surface comes through and transfers to the thickness variation, the thickness variation includes a highest point on an outer edge of the mask and a lowest point in the middle of the mask and the snapshotting the thickness variation includes the highest point on the outer edge of the mask and the lowest point in the middle of the mask.

12. A computer program product comprising a computer readable storage medium having program instructions embodied therewith, and the program instructions are readable by a computing device to cause the computing device to:
 find a thickness variation by subtracting a flatness between a frontside surface and a backside surface of a mask blank;
 fit the thickness variation with a polynomial fit;
 generate a residual structure by subtracting the polynomial fit from the thickness variation; and
 find a residual flatness measurement by taking a difference between the highest points on a surface of the residual structure and the lowest points on the surface of the residual structure, wherein the thickness variation is a measurement for the entirety of the mask blank to be analyzed for the thickness variation, and any differences between the frontside surface and the backside surface are measured throughout the mask blank.

13. The computer program product of claim 12, wherein the mask blank is configured and structured for use with ultraviolet lithography.

14. The computer program product of claim 12, wherein the polynomial fit is comprised of correcting coefficients.

15. The computer program product of claim 14, wherein the correcting coefficients are a scanner linear correction and a scanner high-order correction.

16. The computer program product of claim 12, further comprising snapshotting the thickness variation to a size which correlates to an area on a wafer which is to be patterned.

17. The computer program product of claim 12, wherein the residual flatness measurement is a non-correctable flatness measurement.

18. The computer program product of claim 17, wherein the non-correctable flatness measurement is less than 16 nm.

19. A system for analyzing mask blank flatness, comprising:
 a CPU, a computer readable memory and a computer readable storage media;
 first program instructions to find a flatness of a frontside surface of a mask blank by taking a difference between a highest point of a topography of the frontside surface of the mask blank at a middle of the topography and a lowest point of the topography of the frontside surface of the mask blank at an outer edge of the topography of the frontside surface;
 second program instructions to find a flatness of a backside surface of a mask blank by taking a difference between a highest point of a topography of the backside surface of the mask blank at a middle of the topography and a lowest point of the topography of the backside surface at an outer edge of the topography of the backside surface;
 third program instructions to find a thickness variation of the mask blank by subtracting the flatness found for the frontside surface from the flatness found for backside surface of the mask blank;
 fourth program instructions to fit the thickness variation with a polynomial fit;
 fifth program instructions to generate a residual structure by subtracting the polynomial fit from the thickness variation; and
 sixth program instructions to find a residual flatness measurement by taking a difference between the highest peaks and the lowest peaks present in the residual structure,
 wherein:
  the thickness variation is a measurement of for the entirety of the mask to be analyzed for the thickness variation and any differences between the frontside surface and the backside surface as measured throughout the mask, and
  the first, second, third, fourth, fifth and sixth program instructions are stored on the computer readable storage media for execution by the CPU via the computer readable memory.

20. The system of claim 19, wherein the mask blank is for ultraviolet lithography.

* * * * *